(12) United States Patent
Edwards et al.

(10) Patent No.: US 7,091,556 B2
(45) Date of Patent: Aug. 15, 2006

(54) HIGH VOLTAGE DRAIN-EXTENDED TRANSISTOR

(75) Inventors: Henry Litzmann Edwards, Garland, TX (US); Sameer Pendharker, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 30 days.

(21) Appl. No.: 10/746,978

(22) Filed: Dec. 24, 2003

(65) Prior Publication Data

US 2005/0145930 A1 Jul. 7, 2005

(51) Int. Cl.
*H01L 29/76* (2006.01)
*H01L 21/336* (2006.01)

(52) U.S. Cl. ............... 257/336; 257/339; 257/344; 438/197; 438/306

(58) Field of Classification Search ............... 257/327, 257/336, 339, 344; 438/187, 197, 199, 218, 438/225, 301, 305–307
See application file for complete search history.

(56) References Cited

U.S. PATENT DOCUMENTS

| 4,926,233 | A | 5/1990 | Hutter | |
|---|---|---|---|---|
| 6,207,994 | B1 * | 3/2001 | Rumennik et al. | 257/342 |
| 6,451,640 | B1 * | 9/2002 | Ichikawa | 438/199 |
| 6,486,512 | B1 * | 11/2002 | Jeon et al. | 257/339 |
| 6,593,621 | B1 * | 7/2003 | Tsuchiko et al. | 257/335 |
| 6,798,020 | B1 * | 9/2004 | Disney et al. | 257/342 |

OTHER PUBLICATIONS

Jeffrey Smith, et al.; "A 0.7um Linear BiCMOS/DMOS Technology for Mixed-Signal/Power Applications"; 1997 IEEE; pp. 155-157.

* cited by examiner

*Primary Examiner*—T. N. Quach
(74) *Attorney, Agent, or Firm*—Rose Alyssa Keagy; W. James Brady, III; Frederick J. Telecky, Jr.

(57) ABSTRACT

The present invention provides, in one embodiment, a transistor (100). The transistor (100) comprises a doped semiconductor substrate (105) and a drain-extended well (115) having a curved region (125) and a straight region (130) surrounded by the doped semiconductor substrate (105). The drain-extended well (115) has an opposite dopant type as the doped semiconductor substrate (105). The transistor (100) further includes a centered source/drain (120) surrounded by the drain-extended well (115) and separated from an outer perimeter (135) of the drain-extended well (115). A separation in the curved region (145) is greater than a separation in the straight region (150). Other embodiments of the present invention include an integrated circuit (300) and a method of manufacturing a transistor (200).

21 Claims, 18 Drawing Sheets

Distance (microns)

Log₁₀ [Dopant]

Distance (microns)

Distance (microns)

Log₁₀ [Dopant]

Distance (microns)

Nominal Mask

Distance (microns)

Pulled Back S/D Mask

Distance (microns)

Nominal Mask

HIGH VOLTAGE DRAIN-EXTENDED TRANSISTOR

TECHNICAL FIELD OF THE INVENTION

The present invention is directed, in general, to a high voltage transistors and in particular a high voltage drain-extended transistor and a method of manufacturing thereof.

BACKGROUND OF THE INVENTION

There is an increasing demand for high voltage transistor devices capable of serving as an interface between low voltage transistors and high voltage end-use devices such as automotive components. It is highly desirable to manufacture high voltage transistors using similar process technology as used for low voltage transistors. The use of similar process technology minimizes the costs of producing high voltage transistors, and allows high and low voltage transistors to be manufactured as part of the same integrated circuit. However, conventional low voltage transistors, such as logic or memory transistors are designed for applications requiring high speed and low power consumption. Consequently, such transistors are highly susceptible to breakdown at sustained operating voltages of about 2 Volts or higher.

To allow operation at higher voltages one transistor design, known as a drain-extended transistor, one design incorporates a lightly to moderately doped region around one or both of heavily doped source and drain structures. This lightly to moderately doped region is known as a drain-extended well. Drain-extended transistors facilitate operation at high voltages (e.g., about 20 Volts or higher reverse bias applied to the drain) by directing a portion of the current from the source to drain to flow into the drain extended well.

Despite their improved performance, drain-extended transistors are still susceptible to high voltage breakdown at the edge of the silicon oxide isolation region, or moat, surrounding the source and drain structures. To reduce the occurrence of breakdown at the bird's beak edge at the moat perimeter, a racetrack or drain-centered layout, is used. In such a layout, the drain extension well surrounds the drain. Such drain-centered layouts, however, are still not entirely successful at avoiding high voltage breakdown. For instance, drain-extended transistors that have a racetrack layout continue to be susceptible to failure as a result of electrostatic discharge (ESD).

Accordingly, what is needed in the art is a method of manufacturing drain-extended transistors having reduced susceptibility to high voltage breakdown.

SUMMARY OF THE INVENTION

To address the above-discussed deficiencies of the prior art, one aspect of the present invention provides a transistor. The transistor comprises a doped semiconductor substrate and a drain-extended well having a curved region and a straight region surrounded by the doped semiconductor substrate. The drain-extended well has an opposite dopant type as the doped semiconductor substrate. The transistor further includes a centered source/drain surrounded by the drain-extended well and separated from an outer perimeter of the drain-extended well. A separation in the curved region is greater than a separation in the straight region.

Another aspect of the present invention is a method of manufacturing a transistor. The method includes forming a doped semiconductor substrate and forming a drain-extended well having the above-described characteristics so as to be surrounded by the doped semiconductor substrate. A centered source/drain is formed so as to be surrounded by the drain-extended well and separated from an outer perimeter of the drain-extended such that the separation in the curved region is greater than a separation in the straight region.

In another embodiment, the present invention provides an integrated circuit. The integrated circuit includes a high voltage transistor, having the above-described characteristics, and a low voltage transistor. The integrated circuit further comprises interconnect metal lines on one of more insulating layers located over the high and low voltage transistors and interconnecting the high and low voltage transistors to form an operative-integrated circuit.

The foregoing has outlined preferred and alternative features of the present invention so that those of ordinary skill in the art may better understand the detailed description of the invention that follows. Additional features of the invention are described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1A:
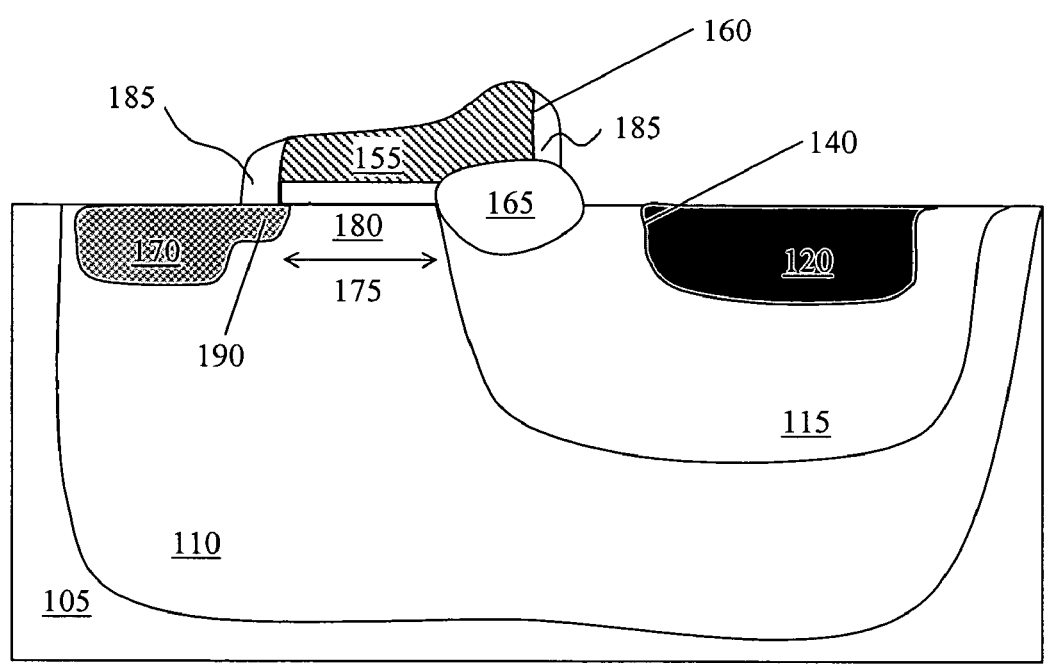
FIGS. 1A to 1B illustrate sectional and plan views, respectively, of selected structures in an exemplary transistor of the present invention.

The present invention benefits from extensive failure analysis testing done on prototype racetrack-type drain-extended transistors. Testing showed that device failure from a simulated ESD event was due to high voltage caused breakdown of the device about the curved end regions of the drain-extended well. In particular, the interface between the drain and drain-extended well was discovered to be highly susceptible to cratering, causing device failure. Extensive modeling and testing of prototype devices, some of which is illustrated in the Example section to follow, lead to the realization that failure in the curved region of the drain-extended well was predominantly due to two phenomena.

First, it was recognized for the first time that the extent of doping in the curved region was lower than expected based on tradition models of dopant diffusion. Traditional models presume that during implantation and thermal diffusion, a dopant diffuses through a substantially cylindrical geometric space. Consequently, the concentration of dopant decreases as a linear function of the distance traveled by the dopant. Although such models may approximate the situation in linear portions of the drain-extended wells, this is not the case in the curved regions. In the curved region, dopants diffuse through a substantially spherical geometric space, where the concentration of dopant decreases as a stronger function of the distance traveled by the dopant than in the cylindrical case. This follows because the "shells" of space the dopant must fill in the curved regions are quadratic.

Second, it was recognized for the first time that the maximum electric field at device breakdown is occurring in the curved region, specifically at the interface between the drain and drain-extended well. The enhanced electric field is due to the curvature of the drain-extended well in this region. This is in contrast to traditional notions of electric field modeling that predict that the maximum electric field is distributed throughout the drain-extended well. Traditional electric field models, however, incorrectly presume that the electric field in the curved regions of the racetrack is substantially the same as in the straight regions. The investigations leading to the present invention found the opposite: the curved region experiences a substantially stronger electric field at breakdown than the linear regions. Consequently, a large portion of an applied voltage is concentrated in the curved region, with little opportunity for current to dissipate through the drain-extended well and thereby prevent breakdown.

One aspect of the present invention is a transistor 100. As illustrated in a cross sectional view through a portion of the transistor 100 in FIG. 1A, the transistor 100 comprises a doped semiconductor substrate 105 and optional doped well 110. The transistor also has a drain-extended well 115 having an opposite dopant type as the doped semiconductor substrate 105. The transistor 100 further includes a centered source/drain 120 that is surrounded by the drain-extended well 115.

As noted above, in some embodiments, it is advantageous for the doped semiconductor substrate 105 to include a doped well 110. For example, when the transistor 100 is a P-type Metal Oxide Semiconductor (PMOS) transistor it can be advantageous to include a p-type doped well 110. Alternatively, when the transistor 100 is a N-type Metal Oxide Semiconductor (NMOS) transistor, it may not be necessary to have a p-type doped well 110, because the doped semiconductor substrate 105 includes a p-type dopant. For instance, semiconductor substrate 105 can be doped or an epitaxially grown p-or n-type doped layer, using conventional procedures. It other instances however, as well understood by those skilled in the art, it can be advantageous to include a p-type doped well 110 in a PMOS transistor 100. One skilled in the art understand that the doped semiconductor substrate 105 could further include a doped well 110 in any embodiments where it would be advantageous to do so.

Figure 1B:
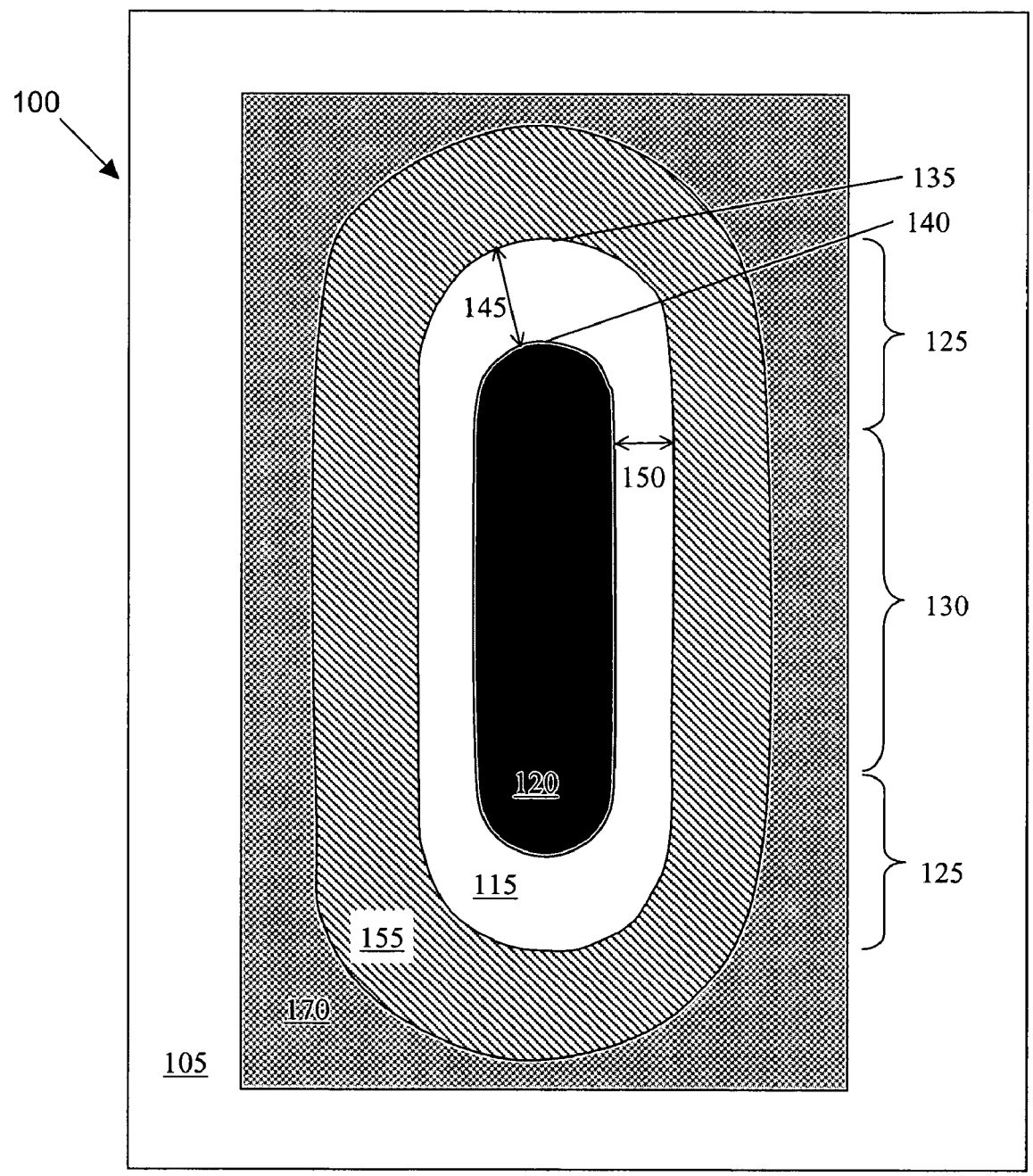

As illustrated in the plan view of selected structures, shown in FIG. 1B, the drain-extended well 115 has a curved region 125 and a straight region 130 surrounded by the doped semiconductor substrate 105. An outer perimeter of the drain-extended well 135 is separated from the drain-extended well 115 in the curved region 125 greater than in the straight region 130. That is, a separation 145 in the curved region 125 between an outer perimeter of the centered source/drain 140 and the outer perimeter of the drain-extended well 135 is greater than a separation 150 in the straight region 130 between the outer perimeter of the centered source/drain 140 and the outer perimeter of the drain-extended well 135. As noted above, the curved region 125 experiences higher electric fields at device breakdown that the straight region 130. While not limiting the scope of the present invention by theory, it is believed that increased separation 145 advantageously reduces the likelihood of breakdown occurring in the curved region 125 by dissipating the electric field through a larger portion of the drain-extended well 115.

As an example, in some preferred configurations of the transistor 100, a ratio of the separation in curved region 145 to the separation in the straight region 150 is between about 1.05:1 and about 1.5:1 For certain configurations, the separation in the curved region 145 is between about 1 micron and about 2 microns. Of course, one skilled in the art would understand that the particular dimensions of the drain-extended well 115 or centered source/drain 120 can be adjusted as further described below, to suit specific design tolerances for high voltage breakdown. For instance, as illustrated in the Example section below, in certain configurations, the transistor 100 has a breakdown voltage of greater than about 65 Volts, and more preferably greater than about 70 Volts.

Conventional procedures, such as scanning capacitance microscopy (SCM) or secondary ion mass spectroscopy (SIMS) measurements, can be conducted to determine dopant concentration profiles for any of the transistor's structures. SCM dopant profiles, for instances, can be used to determine the perimeter of various structures in the transistor 100, such as the doped well 110, the drain-extended well 115 and the centered source/drain 120. The term, outer perimeter, as used herein, refers to a location in the transistor's structures where a concentration of dopant decreases by the steepest amount per unit distance from the structure's maximum concentration.

The above-described design considerations are in contrast to that used in conventional transistor devices. As noted above, the present invention benefits from the discovery that dopants do not diffuse as far through the curved region 125 as through the straight region 130, illustrated in FIG. 1B. Consequently, in a conventional design, where the separation in the curved region 145 is intended to be equal to the separation in the straight region 150, after a thermal diffusion step, the separation in the curved region 145 is actually less than the separation in the straight region 150.

Returning to FIG. 1A, with continuing reference to FIG. 1B, certain preferred configurations of the transistor 100 further include a gate 155 located over the doped semiconductor substrate 105 or doped well 110, wherein a perimeter of the gate 160 and the perimeter of the centered source/drain 140 are separated by an amount that would depend upon device scaling. One skilled in the art would understand how to determine the appropriate separation. For example, one could simulate the breakdown and drive it to be equal to the straight region 150 breakdown. Alternatively, one could build test structures with a series of separation values and find the one that equalizes the breakdown values between the curve region 145 and straight region 150. Separation between the gate 155 and centered source/drain 120 advantageously promotes the dissipation of current into the drain-extended well 115, thereby increasing of maximum operating voltage of the transistor 100.

Other preferred embodiments of the transistor 100 further include an isolation region 165 between the gate 155 and the centered source/drain 120. The isolation region 165 advantageously further enhances the ability of the transistor 100 to tolerate higher voltages. In some configurations, the isolation region 165 is a field oxide thermally grown on the substrate 105 or doped well 110 using conventional local oxidation of silicon (LOCOS) processes well known to those skilled in the art. In other configurations, however, the isolation region 165 is a shallow trench isolation (STI) structure.

The transistor 100 preferably also include a second source/drain 170 in the doped semiconductor substrate 105. The second source/drain 170 and the perimeter of the drain-extended well 135 form a channel region 175 there between. In yet other embodiments of the transistor 100, sidewalls 185 are located adjacent to the gate 155, to facilitate the formation of one or more lightly doped drain regions 190 around one or both of the second source/drain 170 or centered source/drain 120. In some embodiments, the channel length typically ranges between about 0.5 microns and about 5 microns. In other embodiments, however the channel length is less than 0.5 microns and more preferably less than about 0.3 microns. Of course, one skilled in the art would understand that the channel length will be selected based on the desired operating voltage of the device 100, such as the doping profiles for the transistor 100, such as the doped semiconductor substrate 105, doped well 110, drain-extended well 115 and lightly doped drain regions 190.

In some configurations, the transistor 100 is a Metal Oxide Semiconductor (MOS) transistor, such as PMOS or NMOS transistor. In other configurations, the transistor 100 is a bipolar transistor, with the centered source/drain 120, extended-drain well 115 and doped semiconductor substrate 105 or doped well 110, serving as emitter, base, and collector, respectively.

One skilled in the art would understand that the dopants selected for implantation into the doped semiconductor substrate 105 or doped well 110 and subsequent thermal diffusion procedures would depend upon the desired transistor configuration. As an example, if the transistor is an NMOS transistor, then the doped semiconductor substrate 105 could contain a P-type dopant such as boron, and the drain-extended well 115 and centered source/drain 120 would contain an N-type dopant such as phosphorus or arsenic.

FIGS. 2A to 2E illustrate sectional views of selected steps of another aspect of the present invention, a method of manufacturing a transistor 200. The method can be used to manufacturing any of the embodiments of the transistor 100 shown in FIG. 1 and discussed above. The same reference numbers are used in FIGS. 2A–2E to represent analogous structure to that shown in FIGS. 1A and 1B.

Figure 2A:
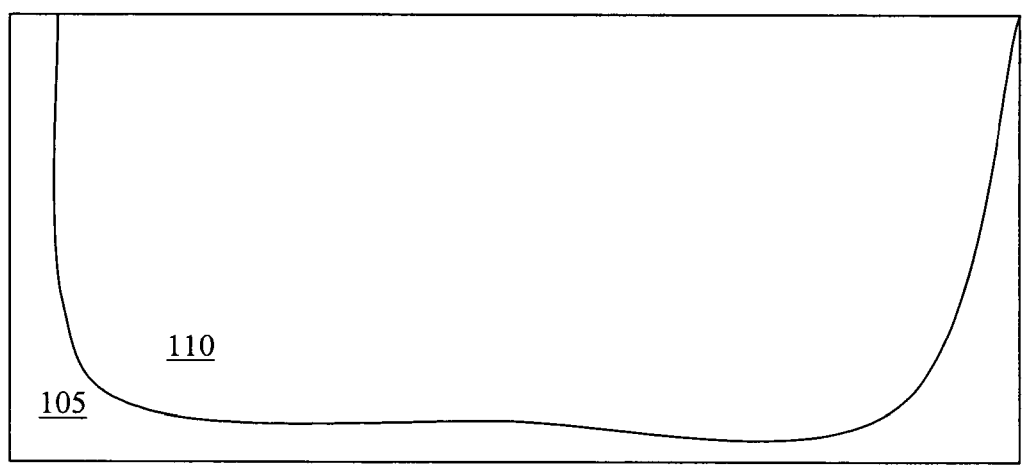
FIGS. 2A to 2I illustrate sectional views of selected steps in a method of making an exemplary transistor according to the principles of the present invention.

Turning first to FIG. 2A, illustrated is a doped semiconductor substrate 105 after forming an optional doped well 110 therein. The doped semiconductor substrate 105 and doped well 110 can be formed by conventional epitaxial growth, or dopant implantation and thermal diffusion, procedures well known to those skilled in the art. For instance, when the transistor 200 is to be a PMOS transistor, then the doped well 110 can be advantageously implanted with a N-type dopant, such as phosphorus or arsenic.

Figure 2B:
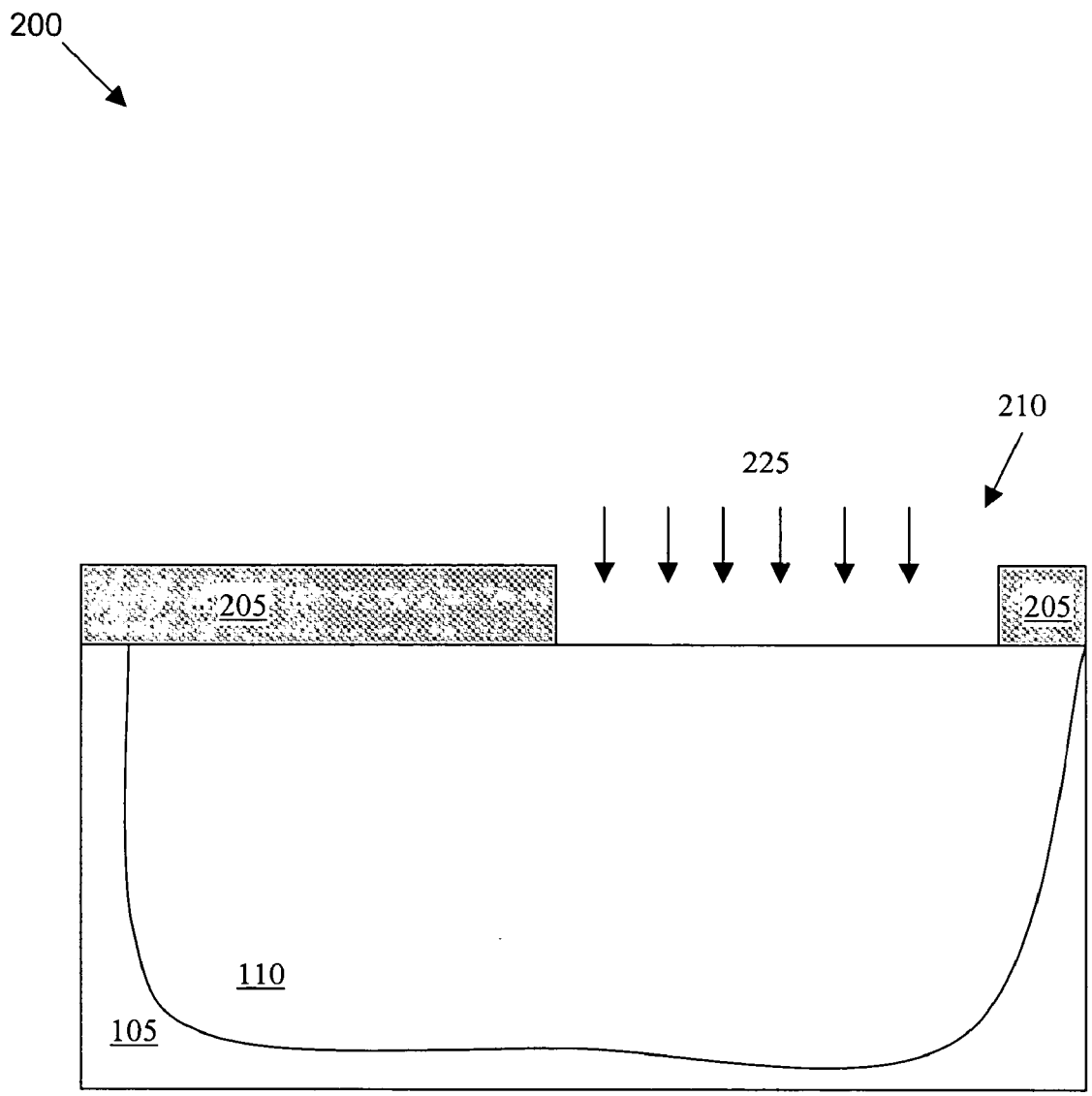

As illustrated in FIG. 2B, in certain preferred embodiments of the method, a mask pattern for the drain-extended well 205 having an opening 210 is formed. In some protocols, a polysilicon layer is deposited and patterned to form the mask 205. In other protocols, however, resist materials, such as photoresist, could be used to form the mask 205.

Figure 2C:
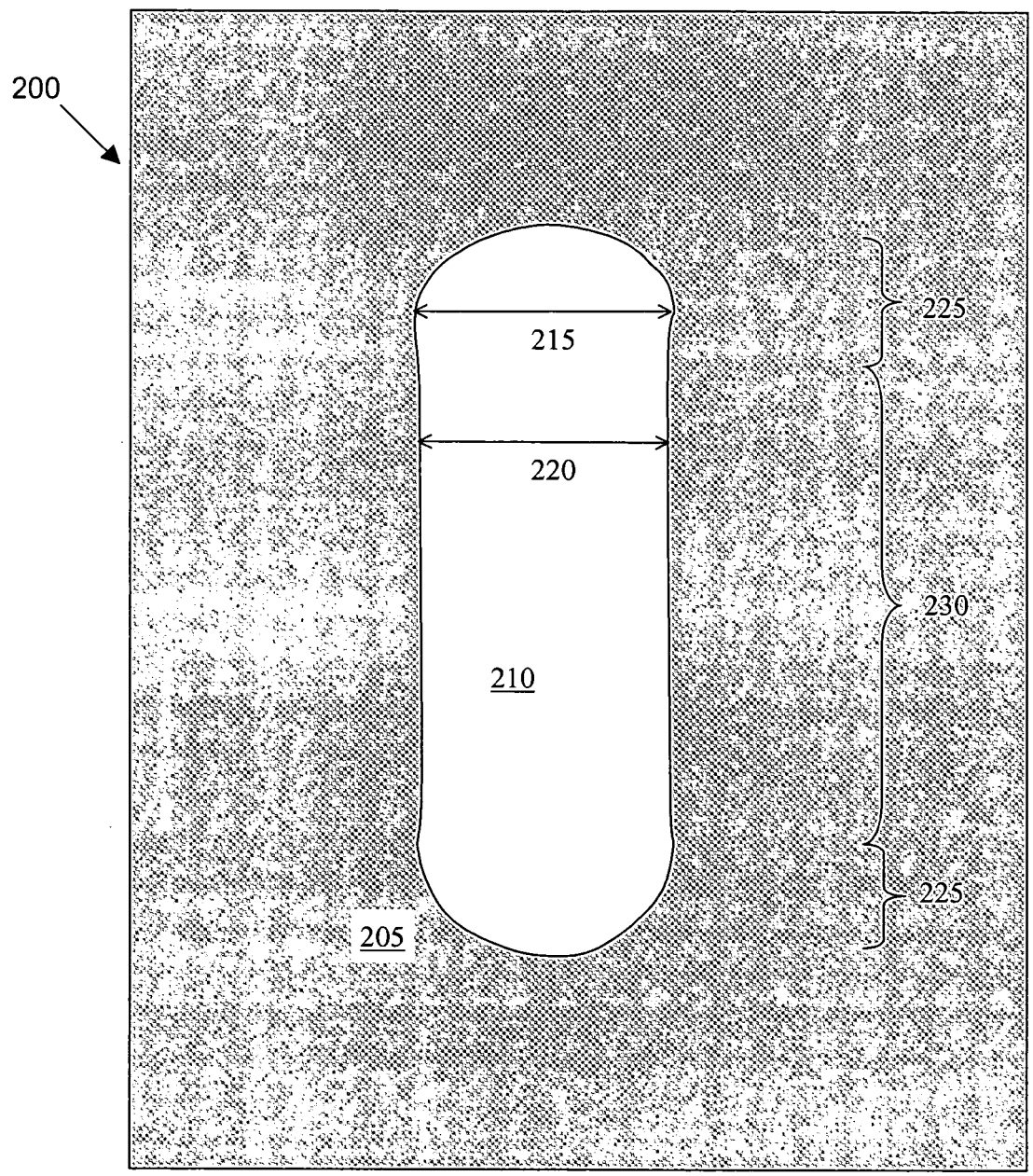

As shown in the plan view shown in FIG. 2C, the mask opening 210 is extended in the curved region so as to achieve greater separation between the planned outer perimeters of the drain-extended well and centered source drain in the curved region. For instance, a width of the mask opening in the curved region 215 is extended as compared to a width of the opening in the straight region 220. Because the opening 210 in the curved region 225 is extended, more dopant is implanted into the curved region 225 as compared to the straight region 230. Extending the volume in the curved region of the drain-extended well helps to prevent the occurrence of high voltage breakdown in this region.

Figure 2D:
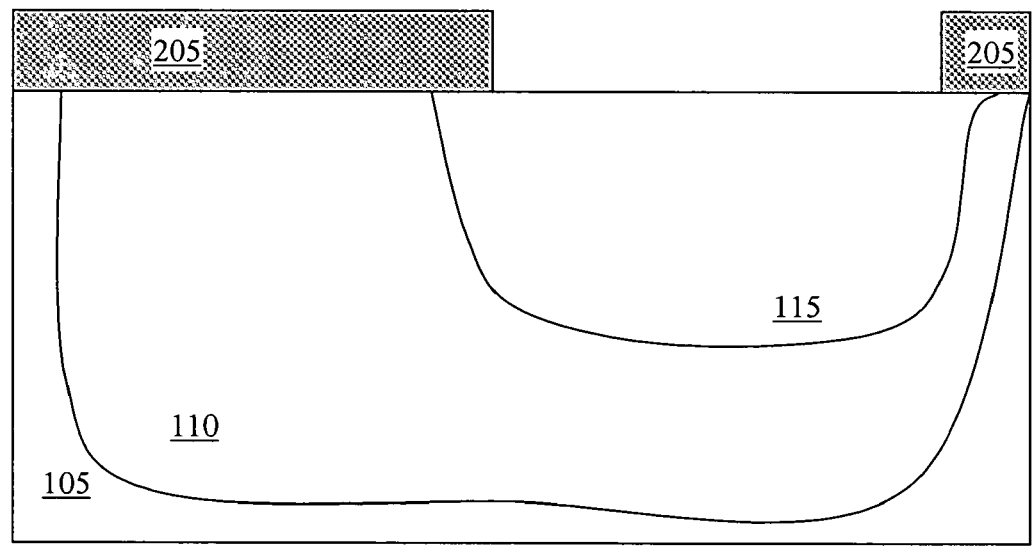

Returning to FIG. 2B, a dopant of the drain-extended well 225 is then implanted through the opening 210. The dopant 225 is of an opposite dopant type as in the doped semiconductor substrate 105. For instance, continuing with the example where the transistor 200 is a PMOS transistor, the drain-extended well 115 can be implanted with a P-type dopant such boron. Implantation is followed by thermal diffusion to form a drain-extended well 115, surrounded by the doped semiconductor substrate 105 or doped well 110, such as shown in FIG. 2D.

Figure 2E:
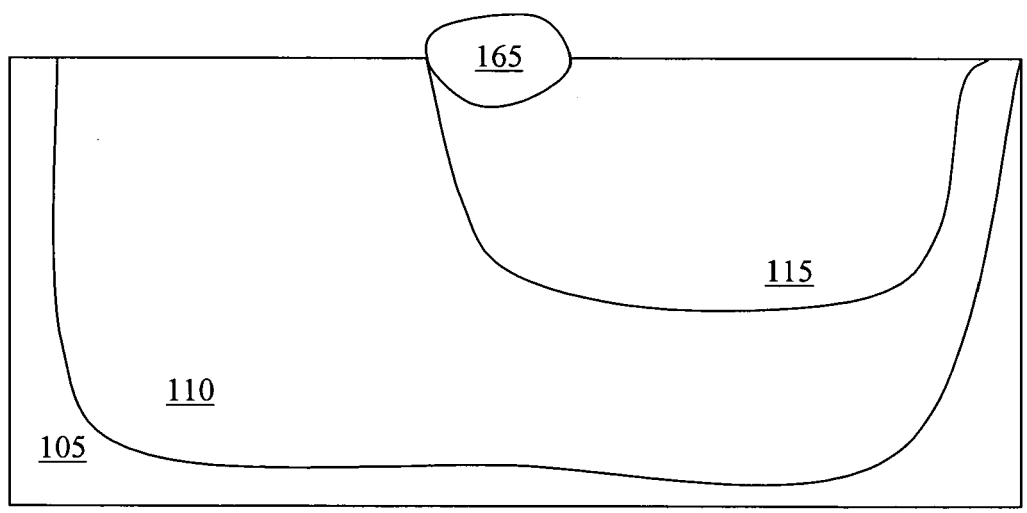

Turning now to FIG. 2E, illustrated is the partially completed transistor 200, after removing the mask pattern for the drain-extended well and forming one or more isolation region 165. The isolation region can be formed by conventional LOCOS and STI procedures well known to those skilled in the art. In certain advantageous protocols, where it is desirable to not expose the isolation regions to the dopant of the drain-extended well 115, the isolation region 165 in formed after thermal diffusion to form the drain-extended well 115. Of course, in other protocols, process considerations may favor forming the isolation regions 165 before forming the drain-extended well 115. Similarly, the isolation regions 165 can be formed before or after forming source drain structures.

Figure 2F:
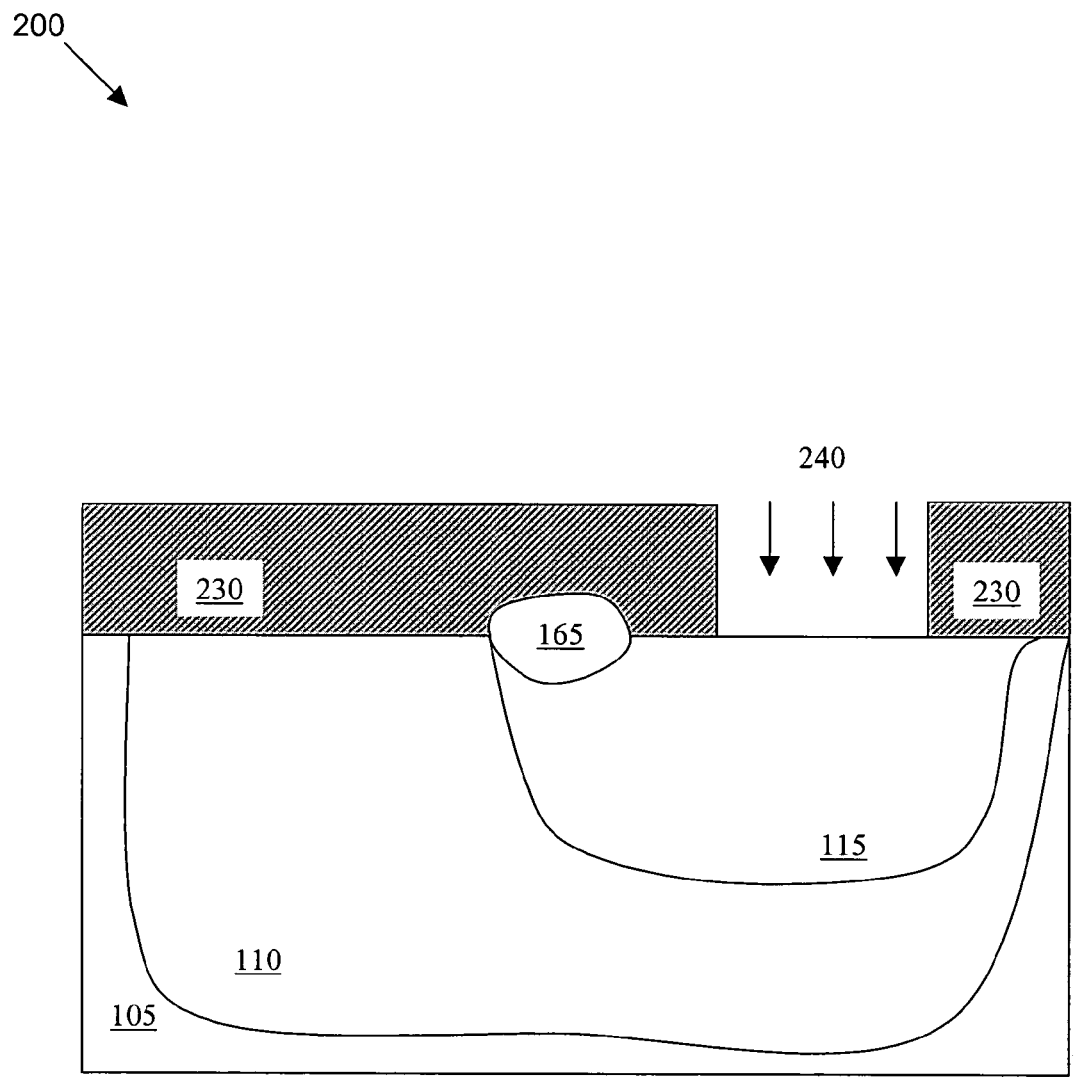

Turning now to FIG. 2F, shown is the partially completed transistor 200 after forming a mask pattern for the centered source/drain 230 with an opening therein 235. In certain preferred embodiments, the mask pattern 230 comprises polysilicon, although materials such as photoresist can be used. In such embodiments, the gate structure may advantageously serve as a portion of the mask pattern for the centered source/drain 230.

As further illustrated in FIG. 2F, a dopant of the centered source/drain 240 is then implanted through the opening 235 of the mask pattern 230. The dopant of the centered source/drain 240 is of the same type as the dopant of the drain-extended well 225. For instance, in the example where the transistor 200 is a PMOS transistor, if the drain-extended well 115 is implanted with a P-type dopant such boron, then the centered source/drain 240 is implanted with boron or other P-type dopant.

Figure 2G:
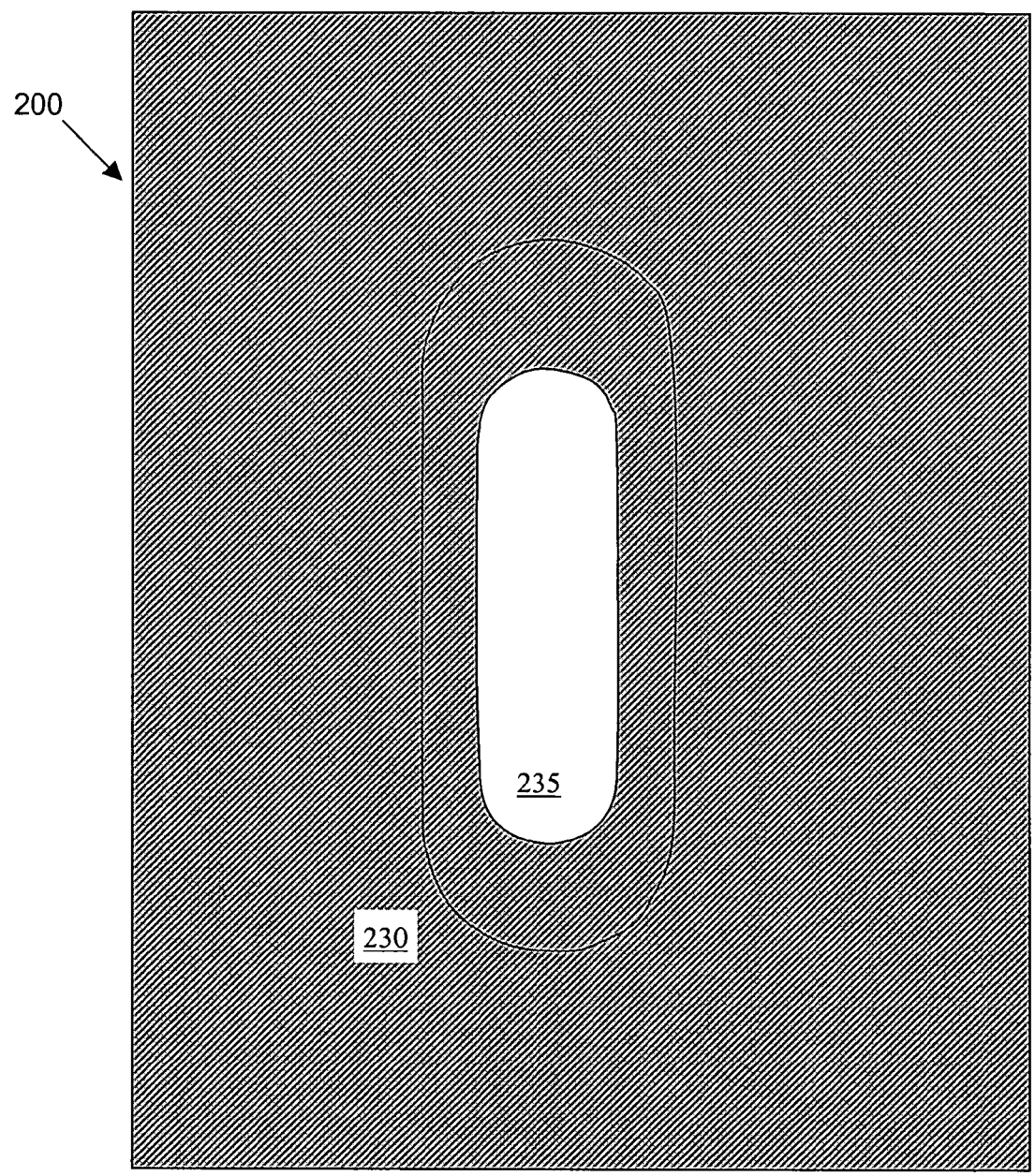

In certain alternative embodiments, such as depicted in the plan view shown in FIG. 2G, the mask pattern for the centered source/drain 230 is pulled back from the perimeter of the drain-extended well 135. The dopant of the centered source/drain is then implanted through the mask opening 235, followed by thermal diffusion, similar to that described above, to form the centered source/drain 120, similar to than shown in FIG. 2F. Pulling back the mask pattern for the centered source/drain 230 achieves the desired greater separation 145 between the outer perimeter of the drain-extended well 135 and the centered source drain in the curved region as previously discussed and illustrated in FIG. 1B.

Figure 2H:
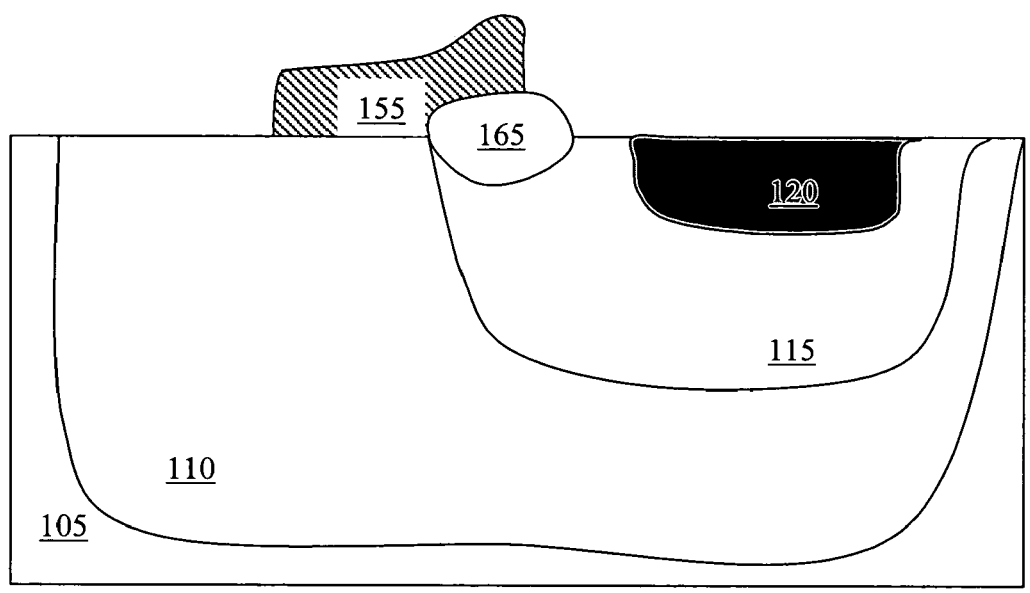

Turning now to FIG. 2H, implantation is followed by thermal diffusion to form the centered source/drain 120 so as to be surrounded by the drain-extended well 115. In embodiments where the mask comprises polysilicon, a portion of the mask pattern is retained to form a gate structure 155.

Extending the mask pattern for the drain-extended well or pulling back the mask pattern for the centered source/drain achieve similar results. Namely, the perimeter of the centered source/drain 140 is separated from an outer perimeter of the drain-extended well 135, wherein a separation in the curved region is greater than a separation in the straight region. Consequently, there is a larger volume of drain-extended well 115 in the curved region for an applied high voltage to dissipate into. Of course, in some protocols, it is desirable to both extend the mask pattern for the drain-extended well and pull back the mask pattern for the centered source/drain.

Figure 2I:
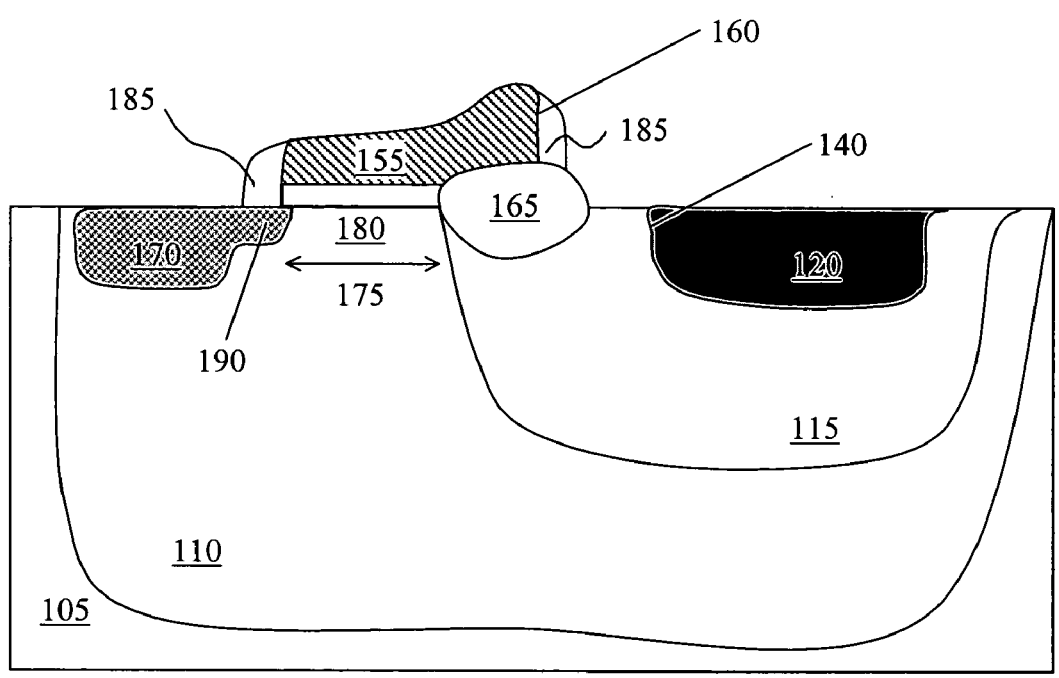

Preferred embodiments of the method further include forming gate sidewalls 185, a second source/drain structure 170, and light doped drain regions 190 using conventional procedures to produce a transistor 200, as shown in FIG. 2I that is substantially similar to the transistor 100 illustrated in FIGS. 1A and 2B. Of course, one skilled in the art would understand that the above process flow illustrates only one of many variations in the method to manufacture the transistor 200 within the scope of the present invention. For instance, source and drain implants can be concurrently formed after polysilicon gate deposition and patterning.

Figure 3:
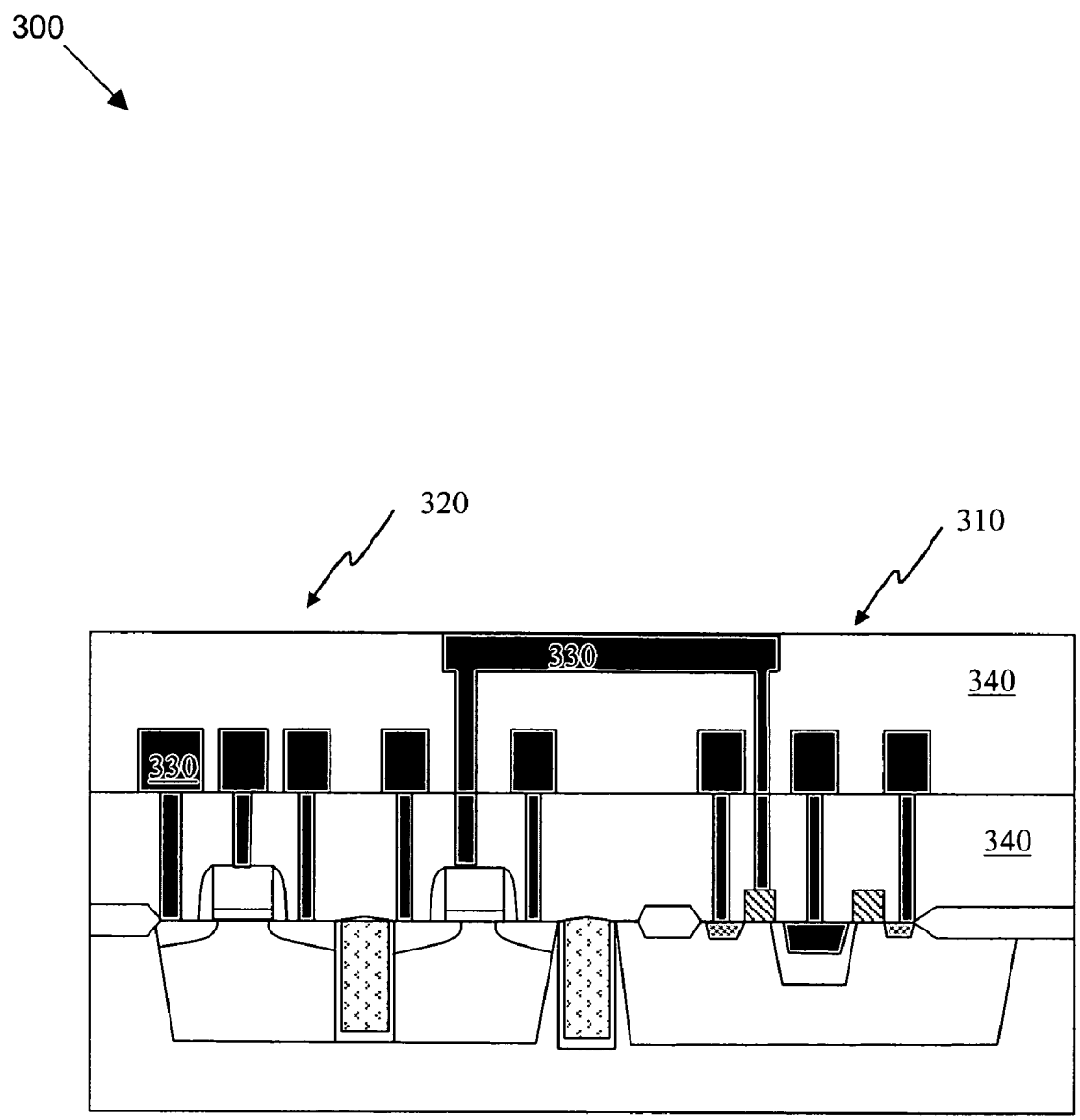
FIG. 3 illustrates a sectional view of components in a partially completed integrated circuit made according to the principles of the present invention.

Another aspect of the present invention is an integrated circuit 300 illustrated in FIG. 3. The integrated circuit includes a high voltage transistor 310. The high voltage transistor 310 can be substantially the same as any of the embodiments of the transistor illustrated in FIG. 1 and discussed above. Any of the methods for forming a transistor shown in FIG. 2A–2J and discussed above can be used to form the transistor 310. In some embodiments, the high voltage transistor 310 includes a complementary MOS (CMOS) transistor and a bipolar transistor.

The integrated circuit 300 also includes a low voltage transistor 320. The low voltage transistor can be any conventional transistor device designed to operate in logic or memory circuits. Non-limiting examples include PMOS, NMOS, CMOS, and bipolar transistors.

The integrated circuit 300 further includes interconnect metal lines 330 on one of more insulating layers 340 located over the high and low voltage transistors 310, 320 and interconnecting the high and low voltage transistors 310, 320 to form an operative integrated circuit.

Having described the present invention, it is believed that the same will become even more apparent by reference to the following example. It should be appreciated that the examples are presented solely for the purpose of illustration and should not be construed as limiting the invention. For instance, although the experiments described below may be carried out in laboratory setting, one of ordinary skill in the art could adjust specific numbers, dimensions and quantities up to appropriate values for a full scale plant.

EXAMPLES

Figure 4A:
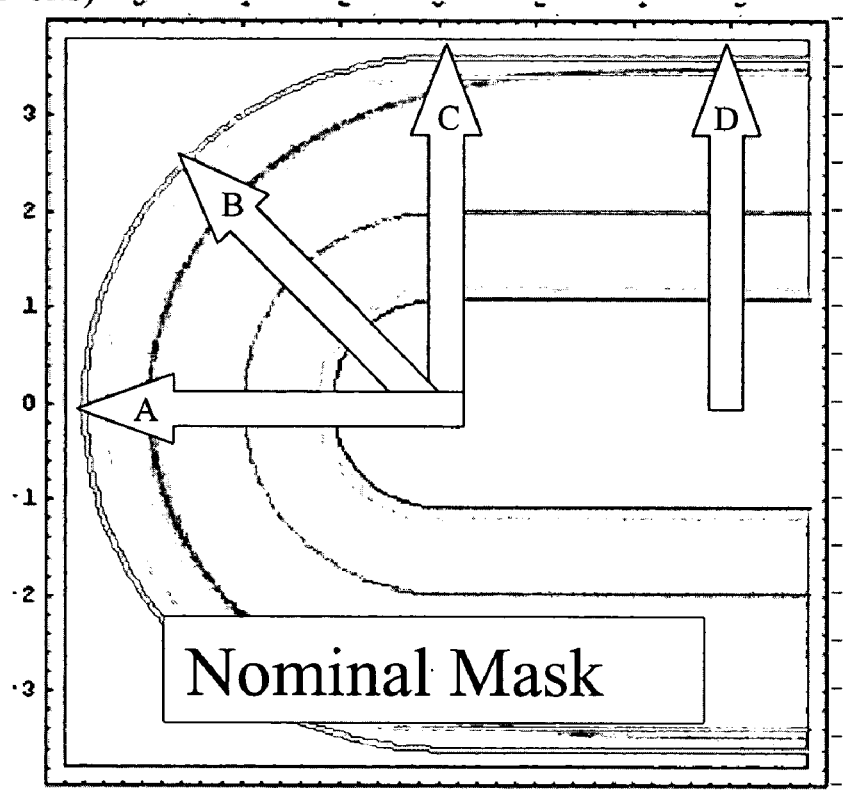
FIGS. 4A–4C presents simulated surface lateral doping profiles in drain-extended well for various prototype transistor devices.
Figure 4A:
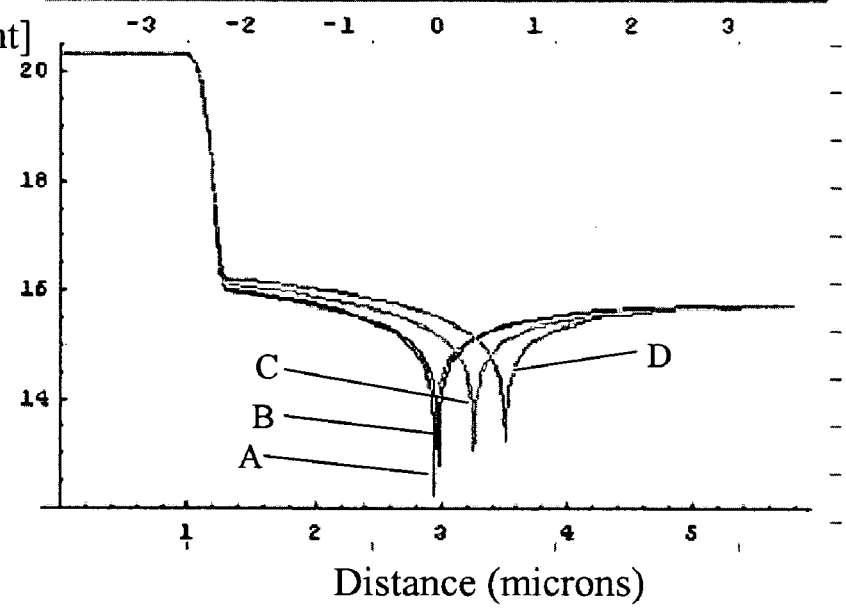
Figure 4B:
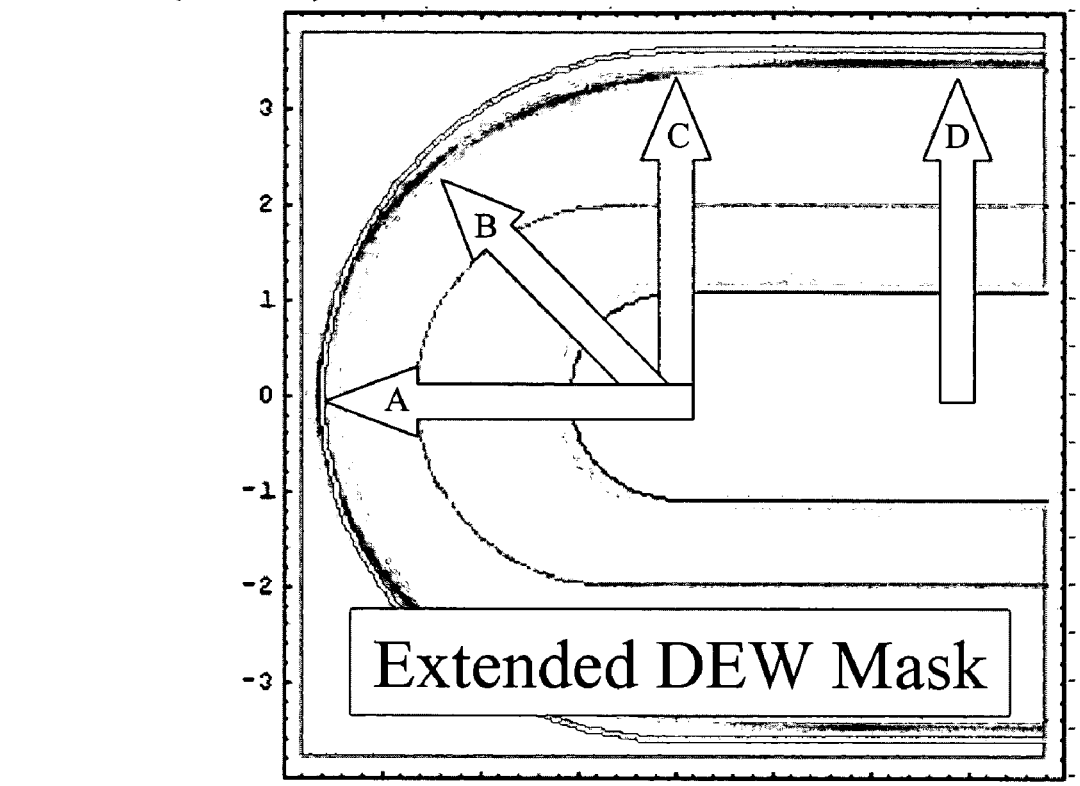
Figure 4B:
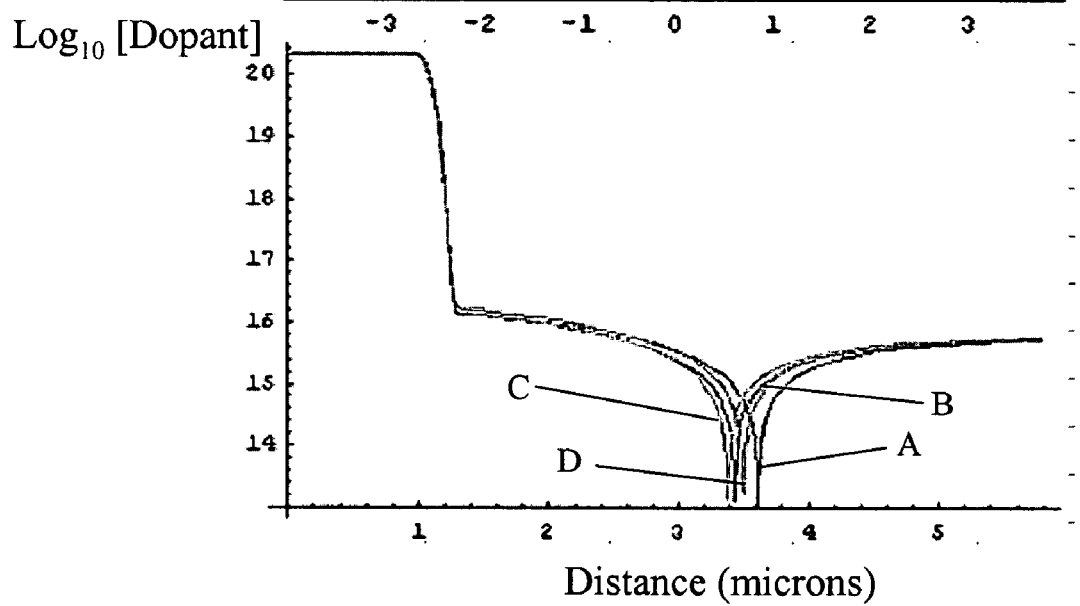
Figure 4C:
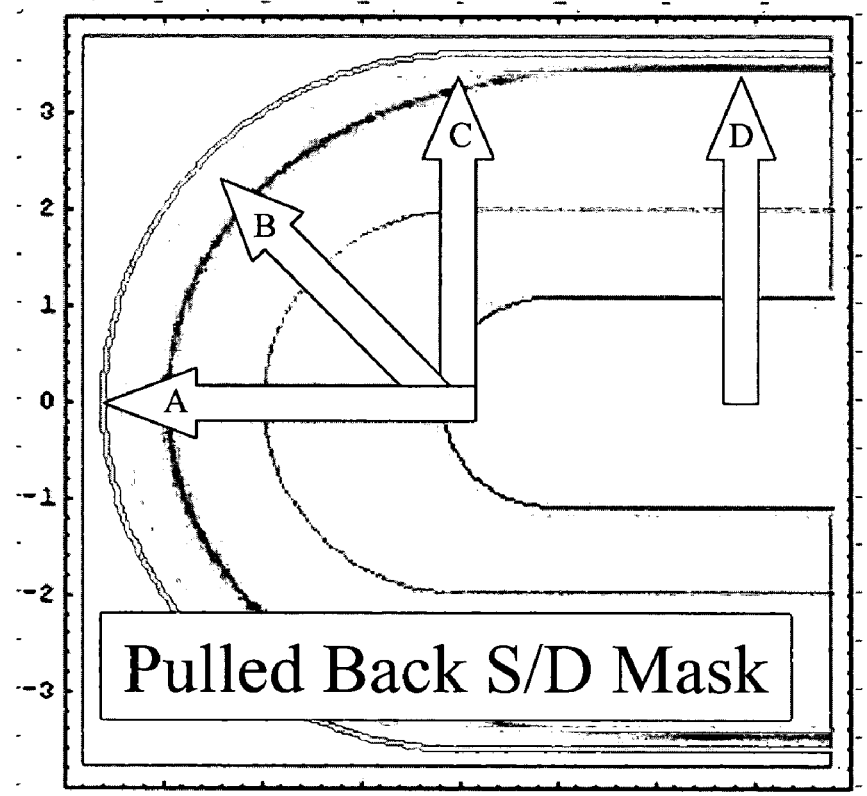
Figure 4C:
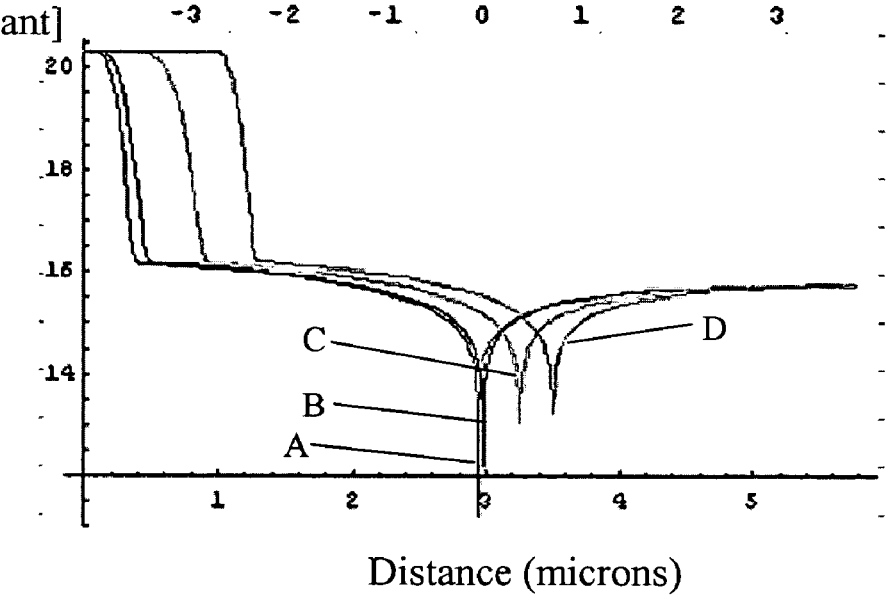

FIGS. 4A–4C presents simulated surface lateral doping profiles in a drain-extended well for various prototype transistor devices. Simulations of doping profiles were obtained by using a three dimensional process simulator. This simulator used a Green's function method to approximate solutions to the diffusion equation from a Gaussian as-implanted dopant profile. Because the diffusion simulations were carried out in three dimensional space, the differences between straight and curved regions of the device could be examined directly. Plots showing the change in dopant concentration as a function of distance for different regions of the drain extended well are also shown.

FIG. 4A shows the dopant profile predicted when using a nominal mask, that is, a mask with openings that would provide drain-extended wells of the same width in both curved and straight regions ("Nominal Mask"). FIG. 4B shows the dopant profile predicted when using a mask that causes the drain-extended well to be extended in the curved regions of the drain-extended well ("Extended DEW Mask"). FIG. 4C shows the dopant profile predicted when using a mask that causes the ends of the centered-drain to be pulled back ("Pulled Back S/D Mask"). The predicted dopant profiles in the curved region are larger when using an Extended DEW Mask or Pulled Back S/D Mask, as compared to using a nominal mask.

Figure 5A:
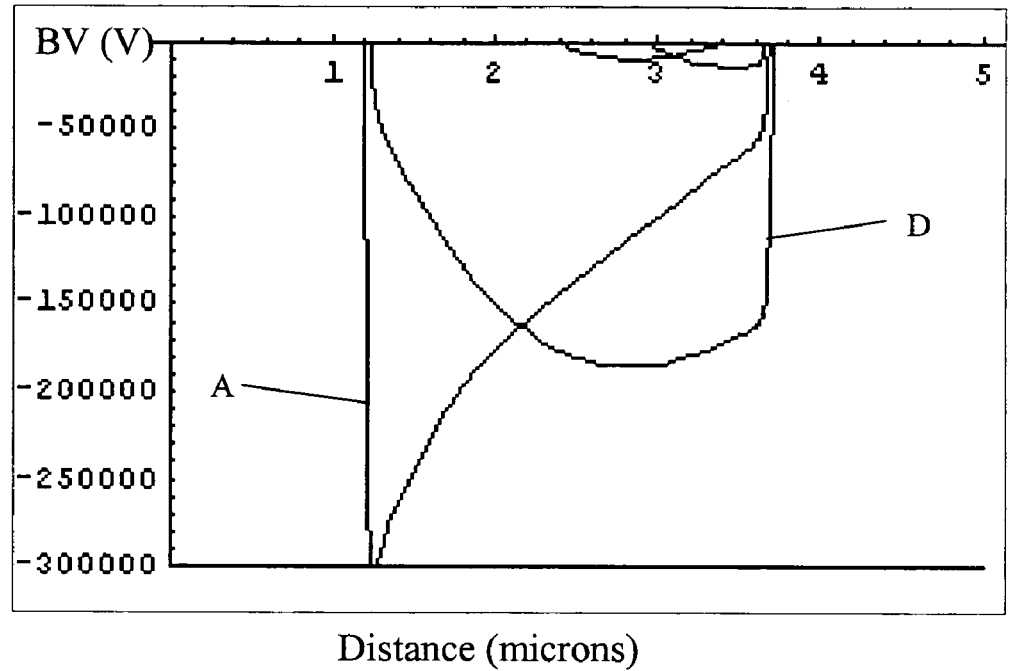
FIGS. 5A and 5B presents simulated electric field distributions in drain-extended wells at high voltage breakdown for prototype transistor devices.
Figure 5B:
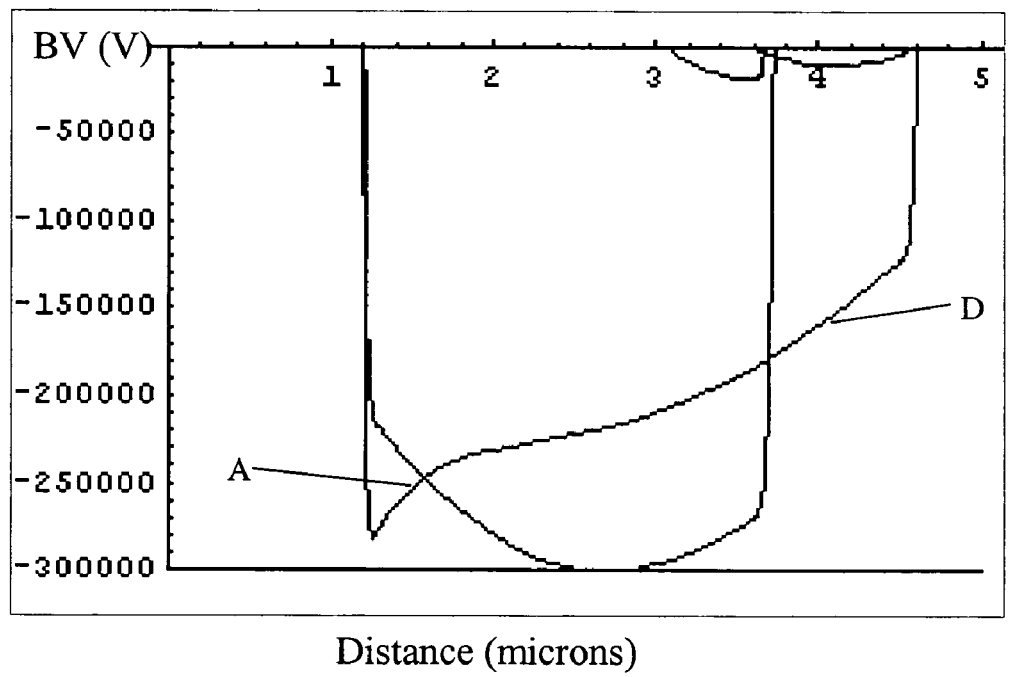

FIGS. 5A and 5B presents simulated electric field distributions in a drain-extended well at high voltage breakdown for prototype transistor devices. FIG. 5A shows the predicted electric field distributions in a drain-extended well produced using a nominal mask similar to that depicted in FIG. 4A. The electric field distribution in the curved region (A) has a sharp maxima at the interface between the drain-extended well and the centered-drain. In contrast, the electric field in the straight region (D) has a smooth distribution throughout the well.

FIG. 5B shows the predicted electric field distributions in a drain-extended well when using a mask that causes the ends of the centered-drain to be pulled back, similar to that depicted in FIG. 4C. The electric field distribution in the curved region (A) is better distributed through the drain-extended well than obtained when using a nominal mask.

Figure 6A:
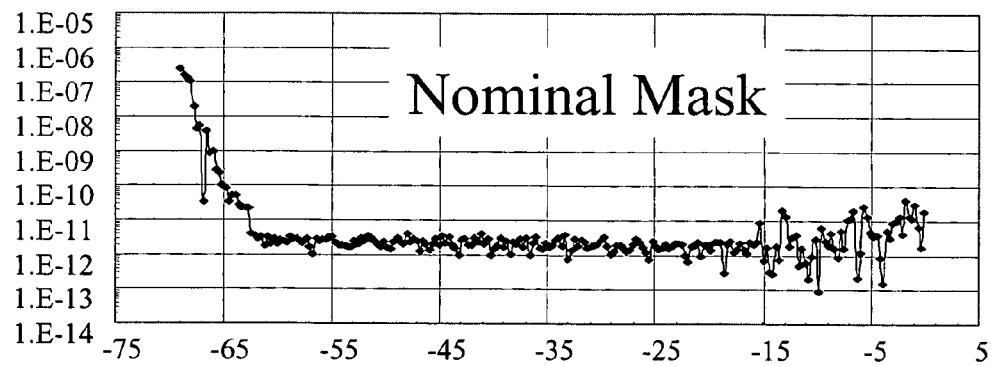
FIGS. 6A–6C presents exemplary experimental data showing the determination of high voltage breakdown for test devices.
Figure 6B:
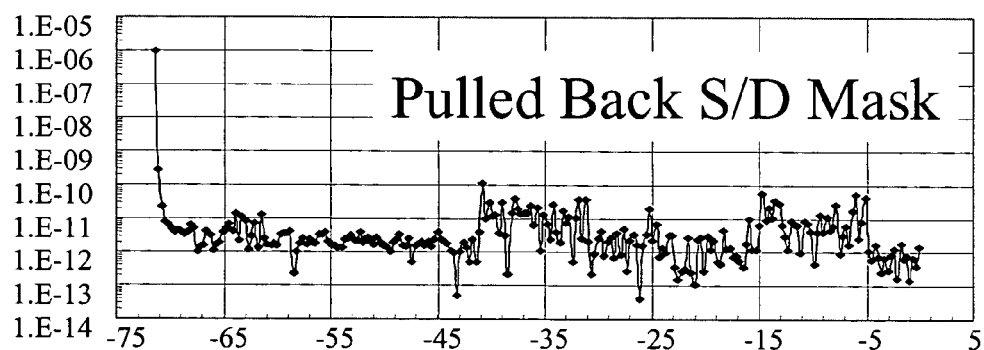
Figure 6C:
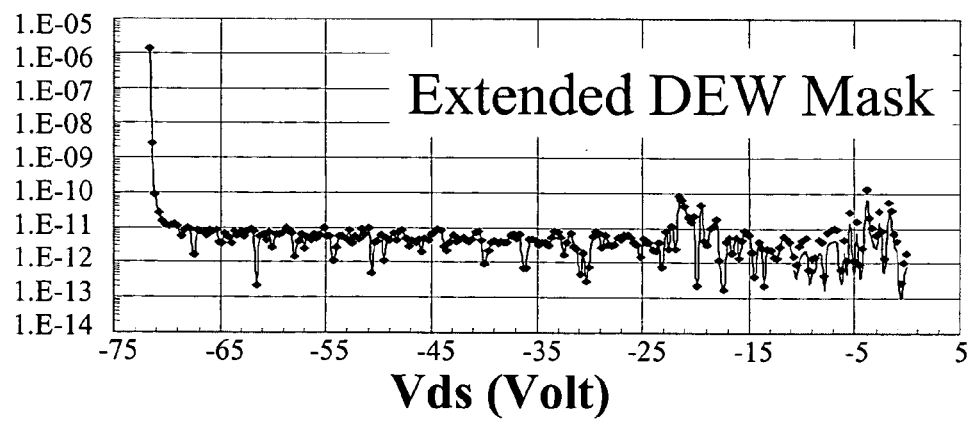

FIGS. 6A–6C presents exemplary experimental data showing the determination of high voltage breakdown for test devices. Test devices were built using a nominal mask, extended DEW mask and pulled back S/D mask. The test devices were fabricated in a conventional production linear BICMOS process as modifications to standard drain-extended PMOS transistors. See e.g., Smith et al., A 0.7 µm linear BICMOS/DMOS technology for mixed signal/power applications, in Proceedings of the 1997 IEEE Bipolar/BiCMOS Circuits and Technology Meeting (BCTM), pp. 100–103 (1997), incorporated by reference herein in its totality.

The breakdown voltages of PMOS devices were measured by taking negative sweeps of drain current versus drain voltage while grounding the source, gate, and back-gate, until the drain current showed a sudden increase. The voltage at which the sudden increase occurs is termed the breakdown voltage. Analogous procedures can be used to determine the breakdown voltage of NMOS devices. As illustrated in FIG. 6A a device made using a nominal mask had a break down voltage of less than 65 Volts. In comparison, devices made using an extended DEW mask and pulled back S/D mask had breakdown voltages of more than 70 Volts.

Figure 7:
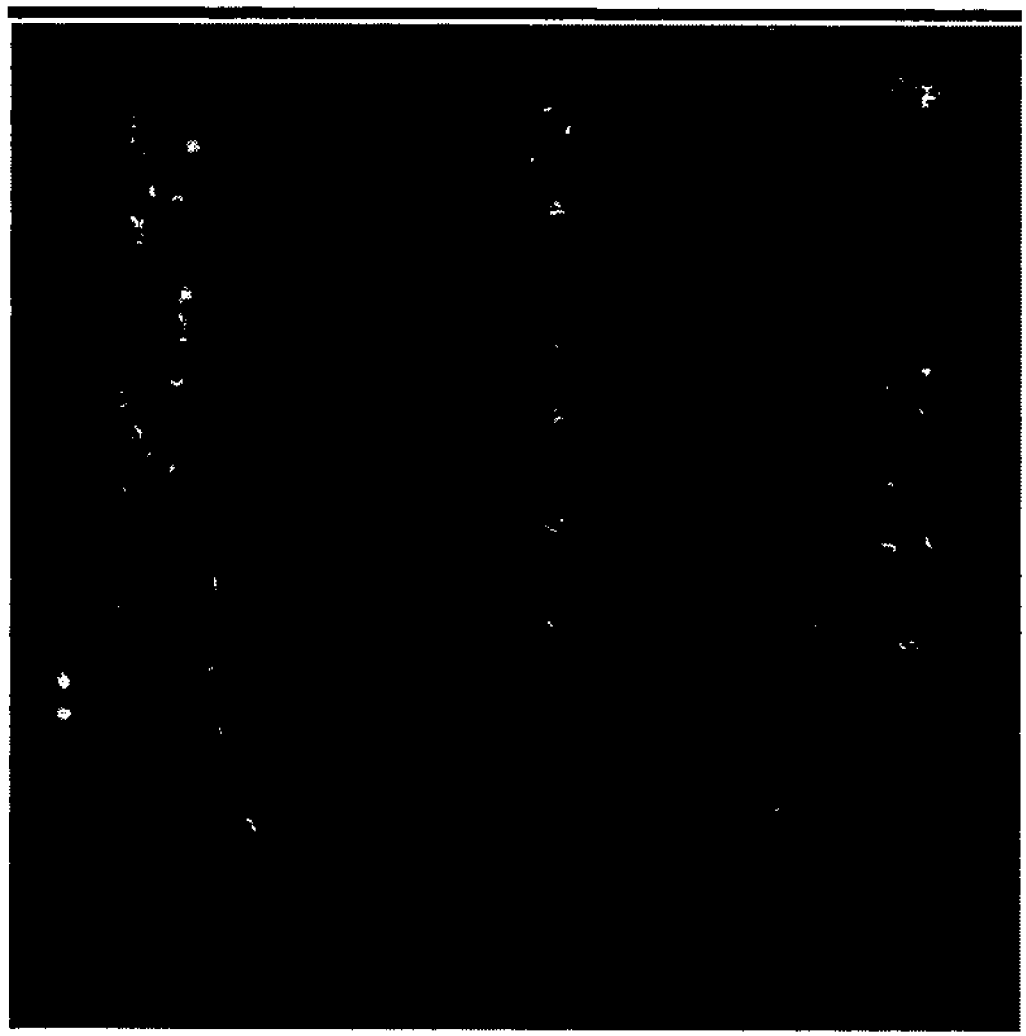
FIG. 7 presents an exemplary scanning capacitance microscopy image obtained for a test device using a nominal mask.

FIG. 7 presents an exemplary scanning capacitance microscopy (SCM) image obtained for a test device using a nominal mask. SCM images were obtained from test devices manufactured using nominal masks, extended DEW masks and pulled back S/D masks similar to that described above. SCM images were obtained using conventional procedures, such as that described in Edwards H. et al., J. Appl. Phys. 87, 1485–1495 (2000), incorporated by reference herein in its totality. As illustrated in FIG. 7 the width of the drain-extended well in the curved region of the well is less than the width in the straight regions.

Although the present invention has been described in detail, one of ordinary skill in the art should understand that they can make various changes, substitutions and alterations herein without departing from the scope of the invention.

What is claimed is:

1. A transistor comprising:
    a doped semiconductor substrate;
    a drain-extended well having a curved region and a straight region surrounded by said doped semiconductor substrate, wherein said drain-extended well has an opposite dopant type as said doped semiconductor substrate; and
    a centered source/drain surrounded by said drain-extended well and separated from an outer perimeter of said drain-extended well, wherein a separation in said curved region is greater than a separation in said straight region.

2. The transistor as recited in claim 1, wherein a ratio of said separation in said curved region to said separation in said straight region is between about 1.05:1 and about 1.5:1.

3. The transistor as recited in claim 2, wherein said separation in said curved region is between about 1 micron and about 2 microns.

4. The transistor as recited in claim 1, further including a gate over said doped semiconductor substrate, wherein a perimeter of said gate is separated from said perimeter of said centered source/drain.

5. The transistor as recited in claim 4, further including an isolation region between said gate and said centered source/drain.

6. The transistor as recited in claim 1, further including a second source/drain In said doped semiconductor substrate, wherein said second source/drain and said perimeter of said drain-extended well forming a channel region therebetween.

7. The transistor as recited in claim 1, wherein said transistor is a P-type Metal Oxide Semiconductor (PMOS) transistor.

8. The transistor as recited in claim 1, wherein said transistor is an N-type Metal Oxide Semiconductor (NMOS) transistor.

9. The transistor as recited in claim 1, wherein said transistor has a breakdown voltage of greater than about 65 Volts.

10. A method of manufacturing a transistor comprising:
    forming a doped semiconductor substrate;
    forming a drain-extended well having a curved region and a straight region so as to be surrounded by said doped semiconductor substrate, wherein said drain-extended well has an opposite dopant type as said doped semiconductor substrate; and
    forming a centered source/drain so as to be surrounded by said drain-extended well and separated from an outer perimeter of said drain-extended well, wherein a separation in said curved region is greater than a separation in said straight region.

11. The method as recited in claim 10, wherein a ratio of said separation in said curved region to said separation in said straight region is between about 1.05:1 and about 1.5:1.

12. The method as recited in claim 10, wherein said separation in said curved region is between about 1 micron and about 2 microns.

13. The method as recited in claim 10 wherein a mask pattern for said centered source/drain is pulled back from said perimeter of said drain-extended well so as to achieve said separation in said curved region.

14. The method as recited in claim 10, wherein a mask pattern for said drain-extended well is extended so as to achieve said separation in said curved region.

15. The method as recited in claim 10, further including forming a second source/drain in said doped semiconductor substrate wherein said second source/drain and said perimeter of said drain-extended well form a channel region therebetween.

16. The method as recited in claim 10, further including forming a gate over said doped semiconductor substrate, wherein a perimeter of said gate is separated from said perimeter of said centered source/drain is separated.

17. The method as recited in claim 16, further including forming an isolation region between said gate and said centered source/drain.

18. An integrated circuit comprising:
    a high voltage transistor including:
    a doped semiconductor substrate;
    a drain-extended well having a curved region and a straight region surrounded by said doped semiconductor substrate, wherein said drain-extended well has an opposite dopant type as said doped semiconductor substrate; and
    a centered source/drain surrounded by said drain-extended well and separated from an outer perimeter of said drain-extended well, wherein a separation in said curved region is greater than a separation in said straight region;
    a low voltage transistor; and
    interconnect metal lines on one of more insulating layers located over said high and low voltage transistors and interconnecting said high and low voltage transistors to form an operative integrated circuit.

19. The integrated circuit recited in claim 18, wherein a ratio of said separation in said curved region to said separation in said straight region is between about 1.05:1 and about 1.5:1.

20. The integrated circuit recited in claim 18, wherein said separation in said curved region is between about 1 micron and about 2 microns.

21. The integrated circuit recited in claim 18, wherein said high voltage transistor includes a complementary MOS transistor and a bipolar transistor.

* * * * *

UNITED STATES PATENT AND TRADEMARK OFFICE
CERTIFICATE OF CORRECTION

PATENT NO.       : 7,091,556 B2                                         Page 1 of 1
APPLICATION NO.  : 10/746978
DATED            : August 15, 2006
INVENTOR(S)      : Henry Litzmann Edwards and Sameer Pendharkar It is certified that error appears in the above-identified patent and that said Letters Patent is hereby corrected as shown below:

In the first or abstract page, INID code 75, the co-inventor's last name "Pendharker" should be --Pendharkar--.

Signed and Sealed this

Seventh Day of November, 2006

JON W. DUDAS
*Director of the United States Patent and Trademark Office*